United States Patent [19]

Dorothy et al.

[11] Patent Number: 5,457,087
[45] Date of Patent: Oct. 10, 1995

[54] HIGH TEMPERATURE SUPERCONDUCTING DIELECTRIC RESONATOR HAVING MODE ABSORBING MEANS

[75] Inventors: Robert G. Dorothy, Kennett Square, Pa.; Viet X. Nguyen, Newark, Del.; Zhi-Yuan Shen, Wilmington, Del.

[73] Assignee: E. I. Du Pont de Nemours and Company, Wilmington, Del.

[21] Appl. No.: 162,740

[22] Filed: Dec. 3, 1993

Related U.S. Application Data

[63] Continuation-in-part of Ser. No. 934,144, Aug. 21, 1992, abandoned.

[51] Int. Cl.$^6$ ............................... H01P 7/10; H01B 12/06
[52] U.S. Cl. ..................... 505/210; 505/700; 505/701; 505/866; 333/99 S; 333/219.1
[58] Field of Search ................ 333/99 S, 202, 333/219.1; 505/210, 204, 160, 162, 310, 700, 701, 866

[56] References Cited

U.S. PATENT DOCUMENTS

| | | | |
|---|---|---|---|
| 4,198,050 | 4/1990 | Dworsky | 505/210 |
| 5,008,640 | 4/1991 | Accatino et al. | 333/219.1 |
| 5,034,711 | 7/1991 | Hendrick et al. | 333/219.1 |
| 5,105,158 | 4/1992 | Fiedziuszko et al. | 333/219.1 X |
| 5,164,358 | 11/1992 | Buck et al. | 505/210 |
| 5,179,074 | 1/1993 | Fiedziuszko et al. | 505/210 |
| 5,324,713 | 6/1994 | Shen | 333/995 X |

FOREIGN PATENT DOCUMENTS

| | | |
|---|---|---|
| 62-51804 | 6/1987 | Japan. |
| 2-277302 | 11/1990 | Japan. |
| 4-207405 | 7/1992 | Japan. |

OTHER PUBLICATIONS

Muller et al., J. Superconductivity, vol. 3, pp. 235–242 (1990).
Taber, Rev. Sci. Instrum., vol. 61, pp. 2200–2206 (Aug. 1990).
Fiedziusko et al., IEEE–MTT–S International Microwave Symposium Digest, vol. 2, pp. 555–558 (1989).
Llopis et al., J. Less-Common Metals, vol. 164 & 165, pp. 1248–1251 (1990).
Driscoll et al., IEEE–Forty–fifth Annual Symposium on Frequency Control, pp. 700–706 (1991).
Shen et al., IEEE–MTS–S Digest, pp. 193–196 (1992).

Primary Examiner—Benny T. Lee

[57] ABSTRACT

A dielectric resonator apparatus for measuring the parameters of high temperature superconducting thin film is disclosed having improved means for positioning the dielectric and substrates, holding the resonator components in place during use, suppressing undesirable modes, adjusting the magnetic dipole coupling, and coupling to an electrical circuit.

20 Claims, 12 Drawing Sheets

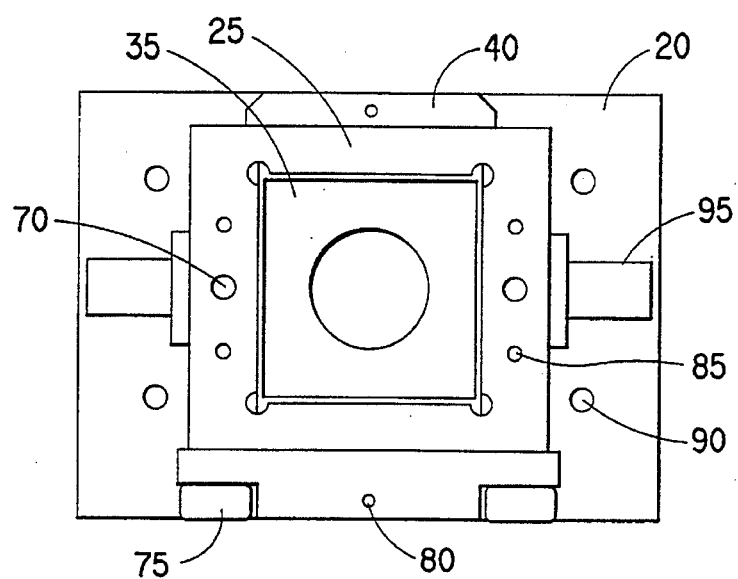
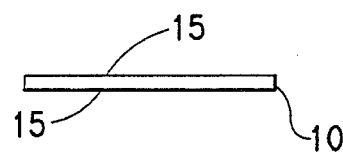
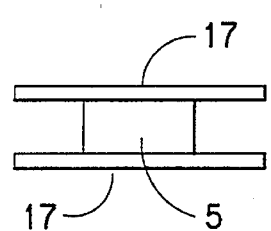
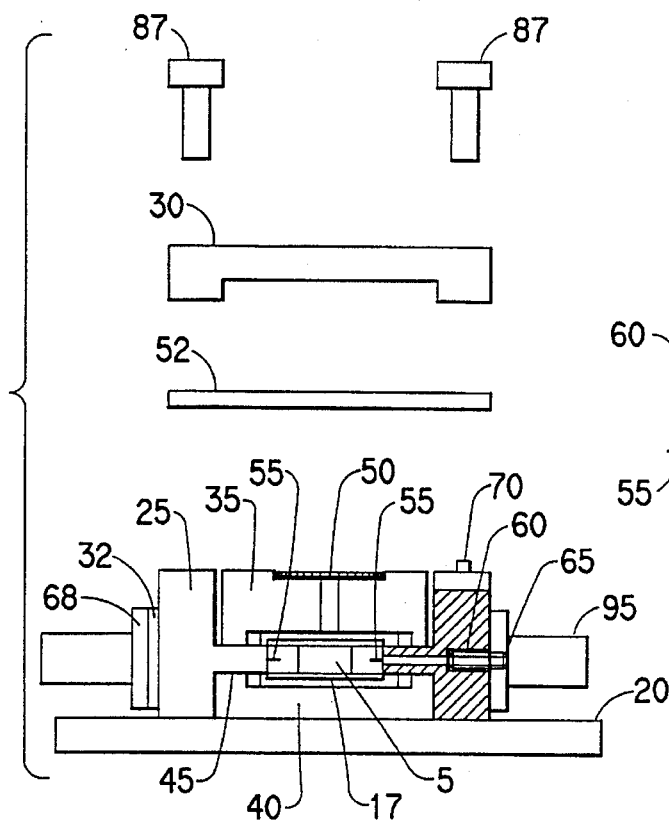
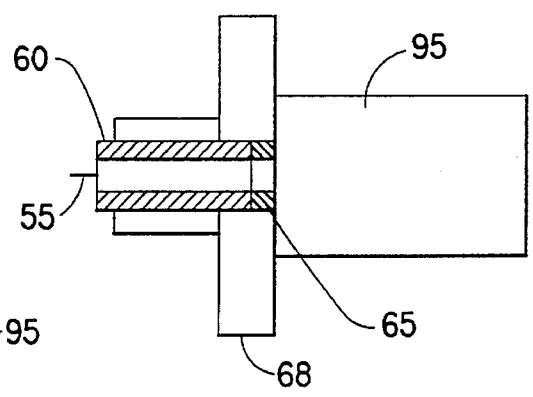

FIG.3a
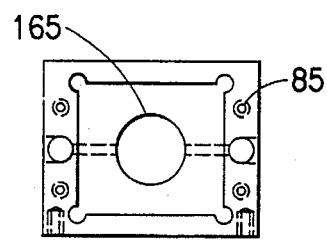
FIG.3e
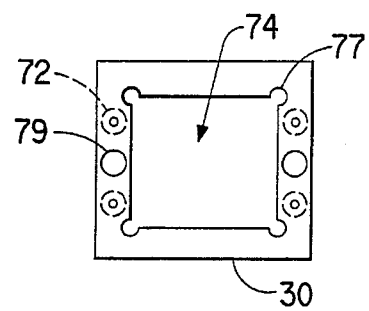
FIG.3d
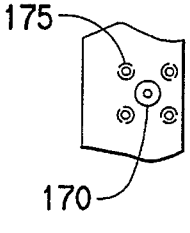
FIG.3b
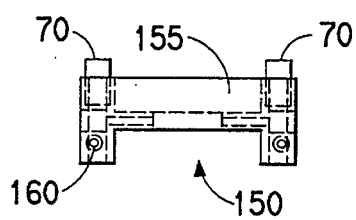
FIG.3f
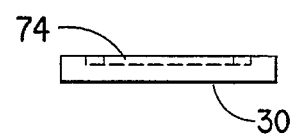
FIG.3c
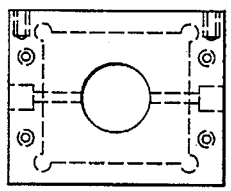
FIG.3g
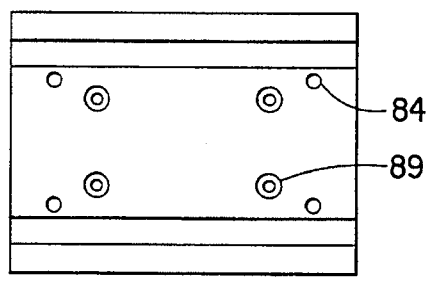
FIG.3h
FIG.3i         FIG.3j                    FIG.3k    FIG.3m
   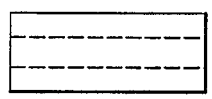      

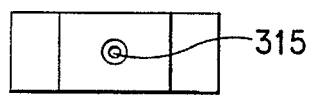
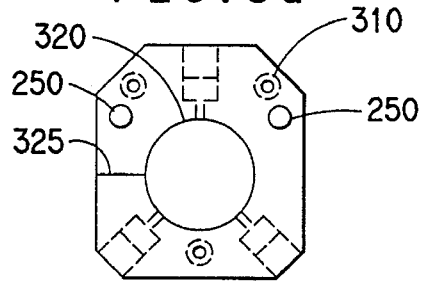
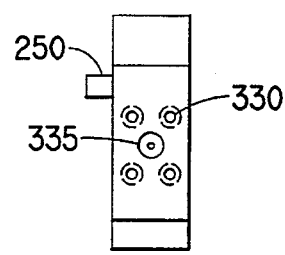
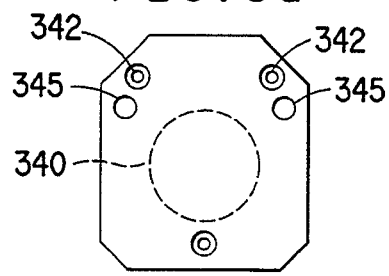
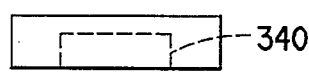
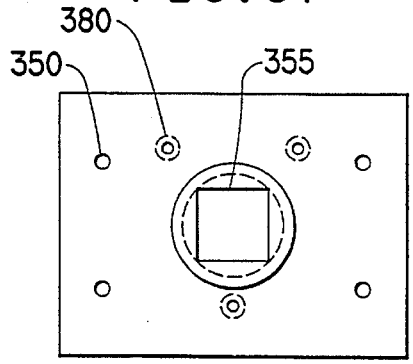
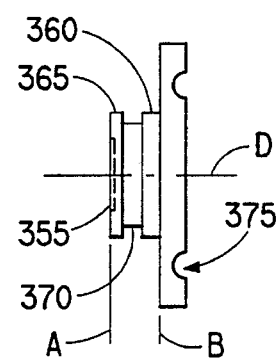

HIGH TEMPERATURE SUPERCONDUCTING DIELECTRIC RESONATOR HAVING MODE ABSORBING MEANS

CROSS-REFERENCE TO RELATED APPLICATIONS

This application is a continuation-in-part of U.S. Ser. No. 07/934,144 filed Aug. 21, 1992, now abandoned.

FIELD OF THE INVENTION

This invention relates to an apparatus which is used to measure high temperature superconducting thin film parameters such as surface resistance, critical current density, and critical magnetic field.

BACKGROUND OF THE INVENTION

The quality of superconductor thin films is described by several parameters: critical temperature, $T_c$, surface resistance, $R_s$, critical current density, $J_c$, critical magnetic field, $H_c$, etc. For microwave and millimeter wave applications, the most important parameter of a superconductor film is the surface resistance, $R_s$, at a given frequency, measured as a function of temperature, current density (or rf magnetic field). Measurement of these parameters accurately is not only necessary for superconductor material research and applications, but is also important for controlling the quality of manufacturing superconducting film.

One method for measuring surface resistance is called "$TE_{011}$ mode cavity end wall replacement" Muller et al., J. Superconductivity, Vol. 3, p. 235–242 (1990). It utilizes a copper cylindrical cavity operating at $TE_{011}$ mode with one of its two end walls replaced by a superconductor film. The $R_s$ of the film can be determined by comparing the Q-values of the cavity with the sample to the same cavity with a calibration standard film (such as niobium or copper) having a known $R_s$ value. This method has the following shortcomings: 1) it requires calibration, so it is not an absolute measurement; 2) the accuracy is limited by the fact that the $R_s$ of the sample film under test only contributes a small portion of the loss in the cavity; 3) the measurable range of the $R_s$ is limited at the low end by the poor sensitivity of this method.

Another method for measuring $R_s$ is called "parallel plate resonator" as disclosed in Taber, R., Rev. Sci. Instrum., Vol. 61, p. 2200–2206 (1990). It is constructed by two pieces of superconducting film separated by a thin dielectric spacer. The $R_s$ of the superconductor film can be determined by measuring the Q-value of the resonator. This method has the following shortcomings: 1) because the spacer is very thin, it is very difficult to couple the rf power in and out of the resonator; 2) since the Q-value is relatively low, the measurable range of $R_s$ is limited at the high end by a weak coupling; 3) since the parallel plate resonator is an open structure, the rf magnetic field is not confined, which results in poor accuracy and case mode interference; 4) it is not an absolute method, calibration is required.

Yet another method is called "dielectric resonator" as disclosed by Fiedziusko et al., IEEE-MTT-S International Microwave Symposium Digest, Vol. 2, p. 555–558 (1989) and by Llopis et al., J. Less-Common Metals, Vols. 164, 165, p. 1248–1251 (1990). There are two different versions. One version involves putting a dielectric resonator on top of the sample superconducting film under testing. Again the $R_s$ of the film can be determined by measuring the Q-value of the resonator. This method has the following shortcomings: 1) the open structure makes it difficult to confine the rf fields, which results in poor accuracy and moding problems; 2) means for holding the dielectric resonator in the right place is a problem. The second version is a superconductor-dielectric-superconductor sandwich. Adding the second superconductor film solved the problems encountered in use of the first version. However, since the dielectric material used has a poor loss tangent factor, the sensitivity of this method is limited.

Currently available apparatus for measuring surface resistance are not suitable for use as a production tool because of their limitations. Films cannot be tested at high power. Measurement is not accurate, and its reproducibility is poor. The dynamic range is limited. The assembly is time consuming. Finally, the measurement is very sensitive to how the films are assembled in the apparatus. Thus there is a need for an apparatus suitable for use in quality control operations for monitoring superconducting film manufacturing processes.

The present invention provides apparatus suitable for improved characterization of high temperature superconducting thin films. Major improvement in performance has been achieved as well as the ability to use the same concept design to make the resonators that can characterize different sizes of superconducting thin films.

BRIEF DESCRIPTION OF THE DRAWINGS

FIG. 1(a) is a top view of resonator #1 with the top plate removed.

FIG. 1(b) is an exploded cross-sectional view of resonator #1.

FIG. 1(c) is a cross-sectional view of a film of a substrate coated with superconducting film.

FIG. 1(d) illustrates the film-sapphire-film structure.

FIG. 1(e) is an cross-sectional view of the connector assembly.

FIG. 3(a) illustrates the design of the body of resonator #1.

FIG. 3(b) is a front view of the body of resonator #1.

FIG. 3(c) is a bottom view of the body of resonator #1.

FIG. 3(d) shows holes for fastening connectors onto the body of resonator #1.

FIG. 3(e) illustrates the design of the top plate of resonator #1.

FIG. 3(f) is a side view of the top plate of resonator #1.

FIG. 3(g) illustrates the design of the bottom plate of resonator #1.

FIG. 3(h) is a side view of the bottom plate of resonator #1.

FIGS. 3(i) and 3(j) illustrate the design of the transition of resonator #1.

FIGS. 3(k) and 3(m) illustrate the design of the insulator of resonator #1.

FIG. 8(a) illustrates the design of the body of resonator #2.

FIG. 8(b) illustrates tapped hole (315) in the side of the body of resonator #2 for screw sub-assemblies (260).

FIG. 8(c) illustrates holes used for attachment of connectors of the side of the body of resonator #2.

FIG. 8(d) illustrates the design of the top plate of resonator #2.

FIG. 8(e) is a front view of the top plate of resonator #2.

FIG. 8(f) illustrates the design of the bottom plate of resonator #2.

FIG. 8(g) is a cross-sectional view of the bottom plate of resonator #2.

SUMMARY OF THE INVENTION

Figure 2A:
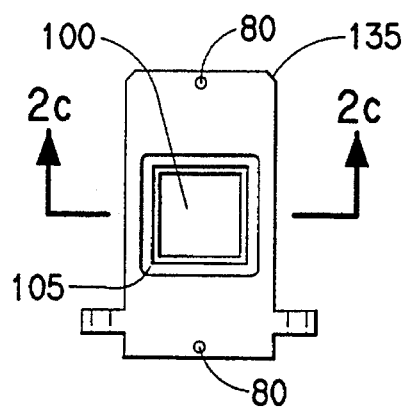
FIG. 2(a) illustrates the design of drawer #1 of resonator #1.

The present invention comprises a dielectric resonator apparatus which operates in TE0iN mode wherein i and N are integers greater than or equal to 1, having a dielectric element of sapphire positioned between and in contact with two discrete films of at least one superconducting material, all encased in an outer enclosure having means for magnetic dipole coupling, wherein the improvement comprises:

(a) means for positioning the sapphire dielectric relative to the outer enclosure;

(b) means for positioning relative to the outer enclosure, loading and unloading superconducting films;

(c) means for holding the sapphire dielectric and superconducting films in place during use;

(d) means for suppressing modes other than TE0iN; and (e) means for adjustment of the magnetic dipole coupling.

The resonator comprises a sapphire and two substrates bearing a coating of high temperature superconducting (HTS) material, hereinafter referred to as films or HTS films. The films are positioned relative to the sapphire to enable the coating to contact said sapphire. The structure of HTS film-sapphire-HTS film in the resonator can be modified, so the microwaves will either be exposed to both the high temperature superconducting material and the outer enclosure material, or it will only be exposed to the high temperature superconducting material at the end planes.

The present invention also comprises a dielectric resonator apparatus having a dielectric element of sapphire positioned between and in contact with two discrete films of at least one superconducting material and a means for magnetic dipole coupling, wherein the improvement comprises a means for moving the resonator to test the superconducting films at multiple discrete areas.

The advantages of the present invention are achieved by devices to obtain exact locations of resonator components, to retain the locations of resonator components during the usage of the resonator in an electrical circuit, to position, to load and to unload the superconducting films, to suppress undesirable modes, to adjust the magnetic dipole coupling, and to couple to an electrical circuit. These devices permit very accurate and repeatable measurements. They also allow for easy assembly, and consequently, reduce the assembly time.

DETAILED DESCRIPTION OF THE INVENTION

Throughout the following description, similar reference numerals refer to similar elements in all figures of the drawings.

Figure 2C:
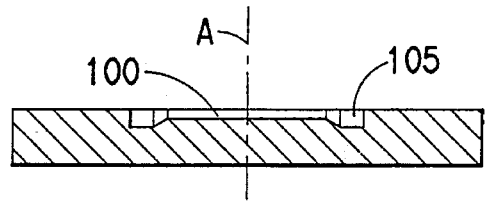
FIG. 2(c) is a cross-sectional view of drawer #1 of resonator #1.
Figure 2B:
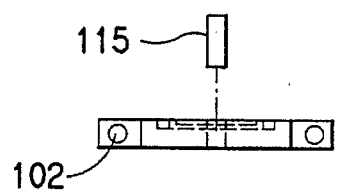
FIG. 2(b) is a front view of drawer #1 of resonator #1.

The present invention comprises three variations of a sapphire resonator for measuring high temperature superconducting thin film parameters. The first resonator design is shown in FIGS. 1(a) and 1(b) and can accommodate two different drawer designs as shown in FIGS. 2(a) and 2(f).

Figure 7A:
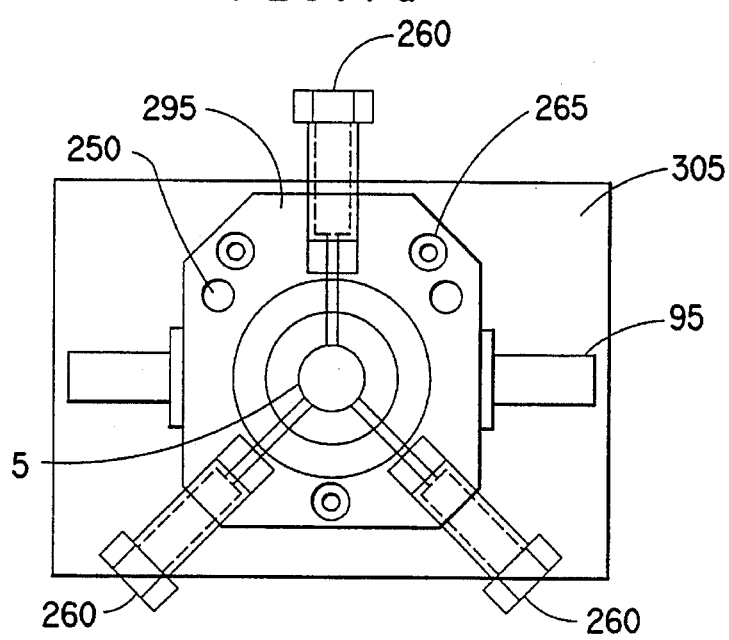
FIG. 7(a) is a top view of resonator #2 with the top plate removed.
Figure 7E:
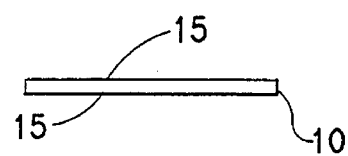
FIG. 7(e) illustrates the film-sapphire-film structure.
Figure 7D:
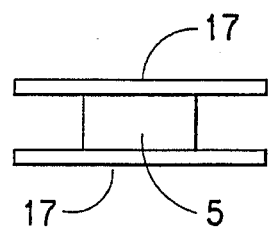
FIG. 7(d) is a cross-sectional view of a film of a substrate coated with superconducting film.
Figure 7B:
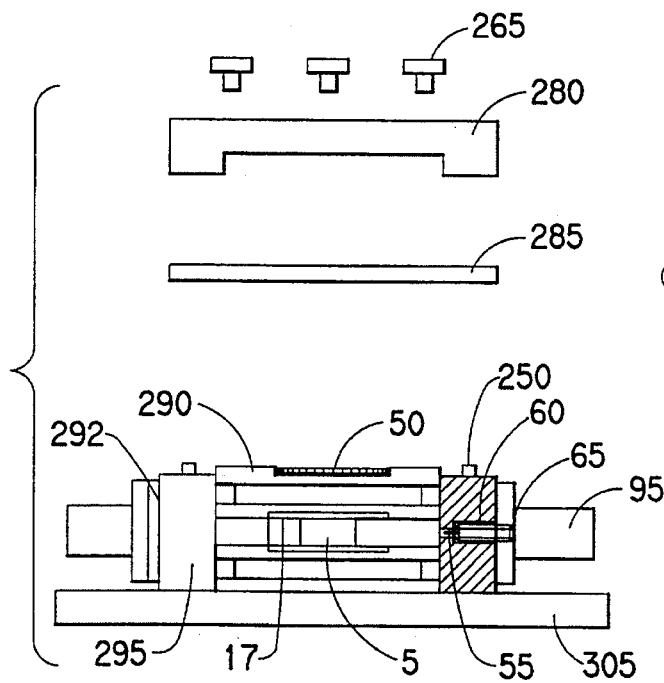
FIG. 7(b) is an exploded cross-sectional view of resonator #2.
Figure 10A:
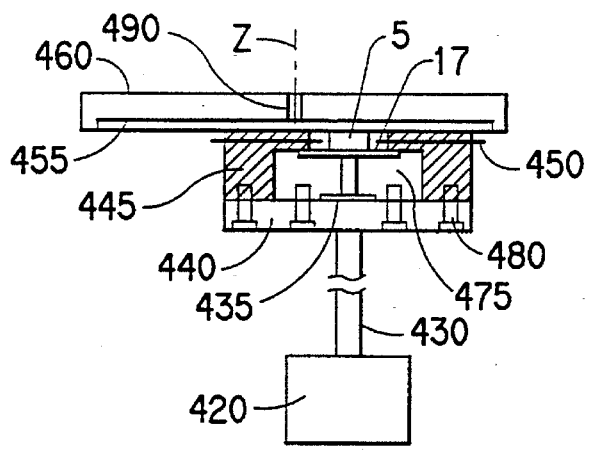
FIG. 10(a) is a cross-sectional view of a modified design of resonator #1.

The second resonator design is shown in FIGS. 7(a) and 7(b). The third design is shown in FIG. 10(a).

The first resonator is shown in FIGS. 1(a), 1(b) and 1(d). As shown in FIG. 1(d) a sapphire dielectric, conveniently a rod (5) is sandwiched between two films (17). FIG. 1(c) shows the film as a substrate (10) which is coated on one or both sides with superconducting materials (15). Substrate (10) must be a single crystal that has a lattice matched to super-conducting material. As shown in FIG. 1(a) the resonator body (25) (outer enclosure) sits on top of the bottom plate (20) containing tapped holes (90) as shown in FIG. 1(b), for assembly screws. FIG. 1(b) shows the bottom film (17) is positioned on a drawer (40) which can be withdrawn out of body (25) for film loading and unloading. In operation, FIG. 1(a) show that drawer (40) containing clearance holes (80) is attached to body (25) by two screws (75). As shown in FIG. 1(b) the sapphire rod (5) is centered in the resonator by a locating device 52. Piston (35) sits on top of sapphire rod (5) and holds the top film (17). A piston locater (52), located relative to the body (25) by pins (70), is used to guide the piston (35) to its exact location relative to the body (25).

A holding device (50), described later, together with the top plate (30) will exert a pressure on the film-sapphire-film structure, and hold the structure in place during the characterization process. Two connector assemblies, FIGS. 1(b) and 1(e), each consist of a connector (95), a transition (60), a cable (55) in the shape of a loop at the end (not shown), one insulator (65) and a flange (68). The connector assemblies couple the resonator to an external electrical circuit. FIG. 1(b) shows shims or spacers (32) are used to adjust the coupling of either connector. The shim (32) is inserted between the resonator body (25) and the flange (68) on the connector to adjust the penetration of cable (55) into the resonator interior. All components of the resonator are fixed in place by screws (87) shown in FIG. 1(b) inserted into tapped holes (85) shown in FIG. 1(a).

The sapphire rod used in this embodiment had a dielectric constant $\epsilon_r=9.2$, and a loss factor ($\tan \delta$) of from $10^{-6}$ to $10^{-9}$ at cryogenic temperatures. Its C-axis must also be perpendicular to its end surfaces within ±1°.

Depending upon the method of locating the sapphire rod, there are two different drawer designs. FIGS. 2(a) and 2(c) show the design of drawer #1. It can be made of any non-ferrous metal which has appropriate electrical conductivity and thermal conductivity. The material used in this embodiment is oxygen free copper. This drawer as shown in FIG. 2(a) and in cross-section in FIG. 2(c) consists of a first recess (100) to hold a film, a second recess (105) surrounding said first recess to hold a microwave frequency absorber, two clearance holes (80) for two dowel pins (115) and as shown in FIG. 2(b) and two holes (102). Holes (102) are for screws (75) shown in FIG. 1(a) to attach the drawer to the body and are in an edge of the drawer perpendicular to the recesses. The depth of recess (100) is such that the surface of the film is slightly above the surface of the drawer, preferably 0.025 mm. The bottom plate, the top of the recess, and the bottom of the drawer must be parallel to each other to within 0.07 mm, preferably 0.025 mm. The above surfaces must also be perpendicular to axis "A" as shown in FIG. 2(c) within ±1°. The drawer #1 has chamfers (135) as shown in FIGS. 2(a) to ease its insertion into the body of the resonator.

Figure 2D:
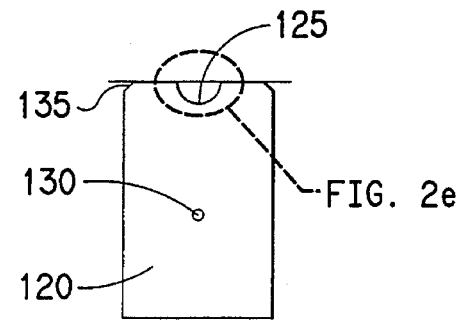
FIG. 2(d) is a top view of sapphire locater #1 of resonator #1.
Figure 2E:
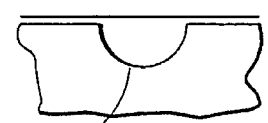
FIG. 2(e) is an enlarged view of arc 125 of sapphire locator #1 of resonator #1.
Figure 2F:
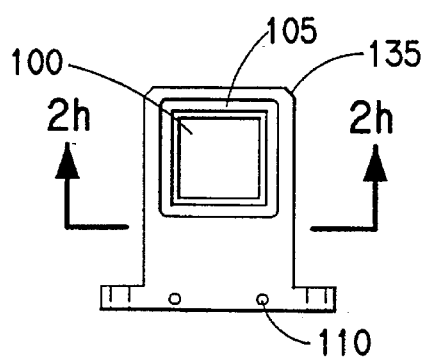
FIG. 2(f) illustrates the design of drawer #2 of resonator #1.

The sapphire locater #1 to be used with drawer #1 is shown in FIG. 2(d). This locater is made of two non-metallic sheets (120) each with a maximum dielectric constant of about 4, and a low dielectric loss such as Kapton®, or any polymer film. Its thickness should be chosen to compromise for the mechanical strength and the dielectric loss. The material used for this embodiment is a polyimide Kapton 300HN® film, 0.076 mm thick. Sheet (120) has a clearance hole (130). Hole (130) permits positioning the sapphire dielectric relative to the outer enclosure by means of a dowel pin. Sheet (120) has an arc or notch (125) with a radius that matches the radius of the sapphire rod. Thus the shape and size of the notch are suitable to fit against the contour of the sapphire dielectric. The width of the sheet (120) is made to fit the slot in the body of the resonator which will be described later. The locater has chamfers (135) at the corners of the edge containing the notch to ease its insertion into the body of the resonator. FIG. 2 (e) shows arc (125) in enlarged detail.

Figure 2H:
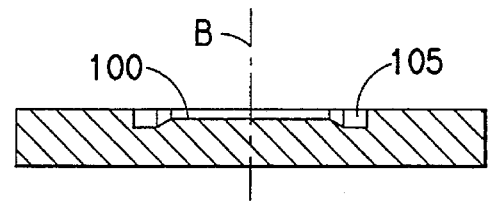
FIG. 2(h) is a cross-sectional view of drawer #2 of resonator #1.
Figure 2G:
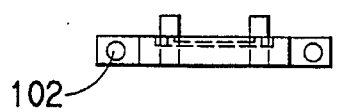
FIG. 2(g) is a front view of drawer #2 of resonator #1.
Figure 2I:
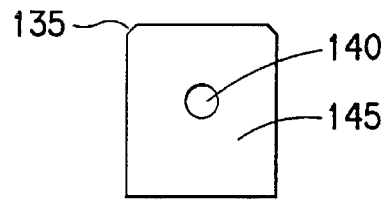
FIG. 2(i) is a top view of sapphire locator #2 of resonator #1.

FIGS. 2(f) and 2(h) show the design of drawer #2. It is made of a non-ferrous metal which has appropriate electrical conductivity and a good thermal conductivity. The material used in this embodiment is oxygen free copper. Similar to drawer #1, it consists as shown in FIG. 2(f) of a first recess (100) to hold a film, a second recess (105) to hold a microwave frequency absorber, two pins (110), two chamfers (135), and as shown in FIG. 2(g), two holes (102). The holes (102) are for screws (not shown) to attach the drawer #2 to the resonator body (25) as shown in FIG. 1(a). The bottom, the top of the recess, and the bottom of the drawer must be parallel to each other within 0.076 mm, preferably 0.025 mm. The above recesses are perpendicular to axis "B" as shown in FIG. 2(h).

The sapphire locater #2 to be used with drawer #2 is shown in FIG. 2 (i). This locater is made of a rectangular non metallic sheet (145) with a maximum dielectric constant of about 4, and a low dielectric loss such as Kapton®, or any polymer film. Its thickness is chosen to compromise for the mechanical strength and the dielectric loss. The material used for this embodiment is a polyimide Kapton 300HN® film, 0.076 mm thick. Sheet (145) has an opening or hole (140) having a size and a shape through which a sapphire rod dielectric will pass with minimal clearance. Sheet (145) width is made to fit the slot in the body of the resonator which will be described later. The locater has chamfers (135) at two adjacent corners to ease its insertion into the body of the resonator.

FIG. 3(a) shows the design of the body of the resonator. At the center of the body is a hole (165). Its diameter is determined such that, including all tolerances built into all components, only film is visible when viewed from the top. No film edges are visible when viewed from the top. Its diameter is also calculated proportionally to the sapphire rod diameter to maximize performance. The ratio between the diameter of hole (165) and the diameter of the sapphire rod must be greater than 2.0. The ratio used in this embodiment is 2.23. The surface created by hole (165) must be polished to reduce the energy loss caused by microwave absorption. Four tapped holes (85) are for assembly screws (87) as previously shown in FIG. 1(b). On top of hole (165) is a recess (155) as shown in FIG. 3(b). The size of this recess is larger than the size of the piston to create an even rectangular gap for helium gas to reach the center of the resonator. On the top surface, there are two dowel pins (70). In the front of the body of the resonator are two tapped holes (160). These are for screws (75) as shown in FIG. 1(a). There is a slot (150) at the bottom. For drawer #1, this slot extends through the entire length of of the resonator. For drawer #2, this slot is only machined partially through. The width of this slot is precisely made to match that of the drawer to ensure the film and the sapphire are exactly located. FIG. 3(c) is a bottom view of the body of the resonator. As shown in FIG. 3(d), hole (170) and tapped holes (175) are used to fasten the connectors onto the body of the resonator.

The top plate (30) as shown in FIG. 1(b) is depicted in detail in FIGS. 3(e) and 3(f). A slot (74) depth is calculated to ensure proper compression of the holding device. The top plate has two locating holes (79), four countersink holes (72), and a through hole (77) for helium gas to enter the resonator. Holes (79) are for dowel pins (70) as shown in FIG. 3(b). Holes (72) line up with tapped holes (85) of FIG. 3(a).

The bottom plate as shown in FIG. 1(b) is depicted in detail in FIGS. 3(g) and 3(h). It has four tapped holes (84) that are used to mount the resonator onto a supporting device (now shown) which is inserted into a dewar (not shown). Four countersink holes (89) are used to bolt it to the body of the resonator. There are two slots (82) for mounting several heaters (not shown) to control and stabilize the resonator temperature.

The cable size to be used in this resonator is one of the factors that affects the sensitivity and the accuracy of the measurements. The cable is depicted as element (55) in the connector assembly shown in FIG. 1 (e). The performance of the resonator improves when small cable is used, because less case mode is developed. The cable used in this embodiment has an 0.94 mm outer diameter. To use this cable with a commercial connector such as Omni Spectra Flange Mount Cable Jack #1006-7985, having an inner diameter of 2.2 mm and an outer diameter of 3.07 mm, available from Omni Spectra, 740 4th Avenue, Waltham, Mass. 02254, a transition as shown in FIGS. 3(i) and 3(j) and an insulator as shown in FIGS. 3(k) and 3(m) are employed to achieve mating. The transition shown in FIGS. 3 (i) and 3 (j) is an electrical conductor tube. It is depicted as element (60) in the connector assembly shown in FIG. 1(e). The outside diameter of the transition fits the inside diameter of the commercial connector, (for this embodiment 2.2 mm). The inside diameter of the transition fits the outside diameter of the cable (0.94 mm in this embodiment). The insulator shown in FIGS. 3(k) and 3(m) is a dielectric ring. It is depicted as element (65) in the connector assembly shown in FIG. 1 (e). Its outside diameter is exactly the same as that of the transition. Its inside diameter is smaller than the diameter of the conductor tube of the transition element to avoid a short circuit between the transition and the center conductor of the connector. The transition is soldered to the connector. The materials used for the transition and the insulator in this embodiment are oxygen free copper and Teflon®, respectively. The penetration of the cables (55) into the resonator is adjusted by inserting/removing shims (32) at the connector flanges as shown in FIG. 1(b).

Figure 4A:
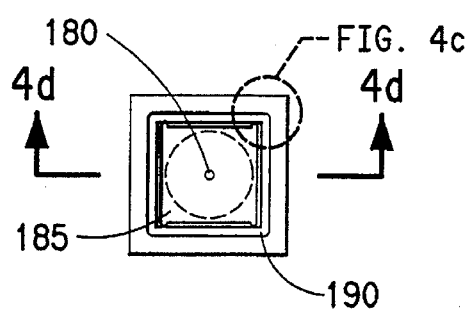
FIG. 4(a) illustrates the design of the piston of resonator #1.
Figure 4C:
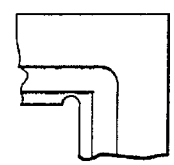
FIG. 4(c) is an enlarged view of a portion of the piston of resonator #1.
Figure 4B:
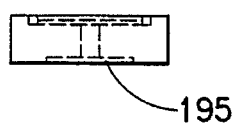
FIG. 4(b) is a front view of the piston of resonator #1.
Figure 4D:
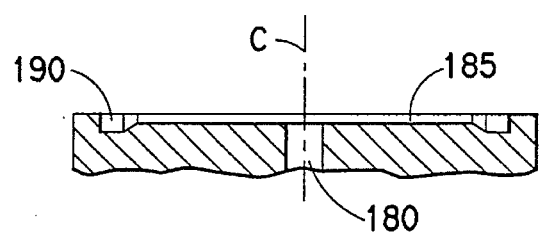
FIG. 4(d) is a cross-sectional view of the piston of resonator #1.
Figure 4E:
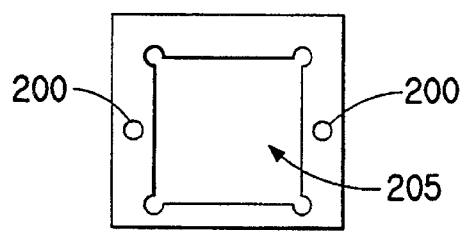
FIG. 4(e) illustrates the design of the piston locater of resonator #1.

FIG. 4(a) shows the design of the piston. It is made of a non-ferrous metal having appropriate electrical conductivity and thermal conductivity. The material used in this embodiment is oxygen free copper. This piston consists of a first recess (185) to hold a superconducting film, a second recess (190) to hold a microwave frequency absorber, a through hole (180) for an externally applied vacuum to reach the superconducting film, and as shown in FIG. 4(b) a counterbore (195) for placement of a holding device. FIG. 4(c) provides enlarged detail of the first recess (185). The depth of recess (185) is such that the surface of the film is slightly above the surface of the drawer. The bottom plate, the top of the recess, and the bottom of the piston must be parallel to each other to within 0.076 mm, preferably 0.025. The above surfaces must also be perpendicular to axis "C" as shown in FIG. 4(d) within ±1°. Elements (185), (190) and (180) are as defined above for FIG. 4(a). The piston fits into the resonator outer enclosure with sufficient clearance to permit the passage of a cooling gas from an external source.

FIG. 4 (e) shows the design of the piston locater. This locator is depicted as (52) in FIG. 1(b). It has two holes (200) that are used with dowel pins to position the piston locater relative to the body of the resonator. The size of slot (205) is large enough, so the piston can drop through with minimal clearance. The clearance between the piston and the piston locater can be in the range from 0.025 mm to 0.15 mm. In this embodiment, all the dimensions are controlled to create at least 0.025 mm clearance between them. The piston is detailed in FIG. 4(a) and is positioned as (35) in FIG. 1(b).

The performance of the resonator greatly depends on the placement of the sapphire rod and the films. There are several locating devices for the sapphire rod. Sapphire locaters #1 and #2 are shown in FIG. 2(d) and FIG. 2 (i). A film is either positioned in the resonator by pin-and-hole fashion, or by confining it into place by any of the known prior art methods such as by use of pins, recess, walls, and the like. The film has a hole at the exact location where the sapphire rod has to be placed. The film can be designed to remain in or to be removed from the resonator before measurements are made. Sapphire locating devices #3 and #4, described hereinafter for resonator #2, can be employed in the resonator #1 if the body is modified in design to accommodate these locating devices.

Figure 5A:
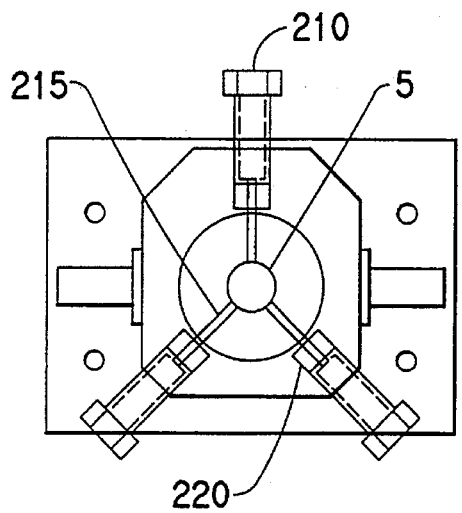
FIG. 5(a) is a top view of sapphire locating device #3.

FIG. 5(a) shows a sapphire locating device #3. In this design, sapphire rod (5) is dropped roughly at the center of the resonator. There are a plurality of modified screws (210) with three non-metallic tips (215) which are glued, soldered, or fastened by any suitable means to the screws. The non-metallic tips of the screws contact the sapphire dielectric. The modified screws turn, and move the rod to the center. The rod will be centered as the screws are stopped by the bottoms of threaded holes (220). Screws (210) will be removed or left in place after rod (5) is secured in place by a holding device. The non-metallic material used for the tips (215) in this embodiment is sapphire.

Figure 5C:
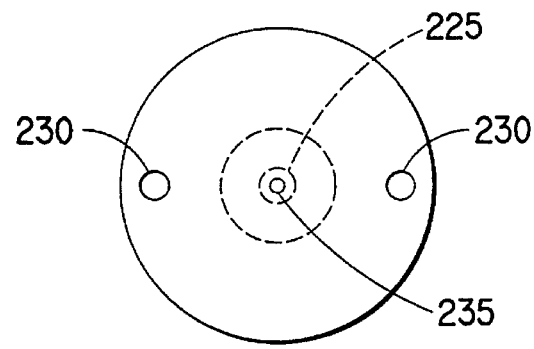
FIG. 5(c) is a bottom view of platform (223) of sapphire locating device #4.
Figure 5B:
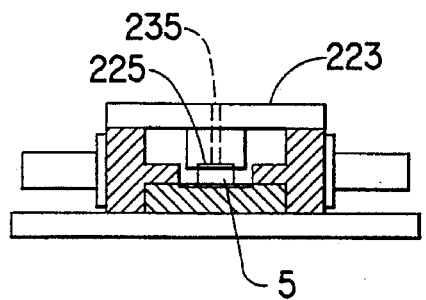
FIG. 5(b) illustrates the design of sapphire locating device #4.
Figure 5D:
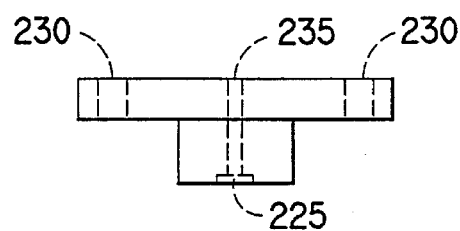
FIG. 5(d) is a side view of platform (223) of sapphire locating device #4.

Another sapphire locating device (#4) is shown in FIGS. 5(b), 5(c) and 5(d). In this design, platform (223) has a perpendicular extension having a recess (225). Sapphire rod (5) is fit into recess (225), and is temporarily held in place in the recess by an externally applied vacuum through hole (235). The sapphire locating device #4 is positioned on top of the body of the resonator by employing two dowel-pin-guiding-holes (230) as seen in FIG. 5(c). Once it is set, the vacuum is turned off to release the sapphire rod (5), and the sapphire locating device #4 is removed. The sapphire rod (5) is then secured by a holding device (not shown).

The sapphire locator devices #1 and #2 as shown in FIGS. 2(d) and 2 (i) may also be employed in resonator #2 if their shape and size is modified to fit the body of this resonator.

Figure 6A:
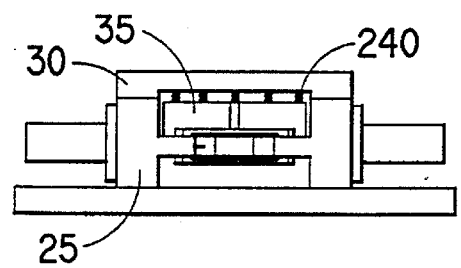
FIG. 6(a) is a cross-sectional view of holding device #1.

Several holding devices can be used to keep all the resonator components from moving during the operation. FIG. 6(a) shows a holding device which is a system of helical compression springs (240) that are distributed evenly on top of the piston (35). These springs are attached to either piston (35) or to the inside surface of top plate (30) by soldering or by other known methods. Once the top plate is screwed on to resonator body (25), the springs will be compressed to produce a desired holding force. The holding force can be adjusted by adding or removing springs, by selecting springs with higher tension rate, or by changing the distance the springs are compressed.

Figure 6B:
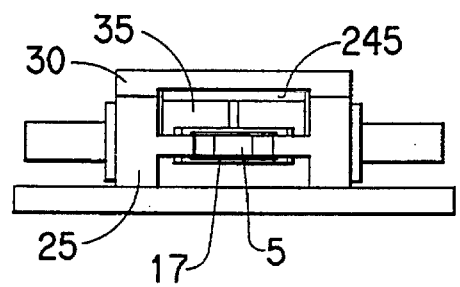
FIG. 6(b) is a cross-sectional view of holding device #2.

Another holding device is shown in FIG. 6(b) comprising plate (245). It is inserted between resonator top plate (30) and piston (35). Plate (245) material is selected such that it will compensate for all the different thermal contractions of material involved in the resonator at cryogenic temperature, such as Teflon®. Thus, the final compression force on film (17) and rod (5) are very close to the force applied on them before the resonator is cooled down.

Figure 6C:
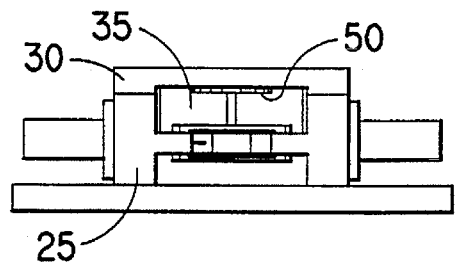
FIG. 6(c) is a cross-sectional view of holding device #3.

The holding device used in the resonator of FIG. 1(b) is shown in FIG. 6(c). A series of Belleville springs (50) (or disc springs) are stacked on top of piston (35). These springs compress the film-sapphire-film structure against the bottom plate when the resonator top plate (30) is screwed on to body (25). The spring force is adjusted by adding or removing springs, by selecting springs with higher tension rate, by stacking the springs in different configurations (parallel or series forms), or by changing the distance the springs are compressed. This holding device is compact because of the Belleville spring design. It is also more stable than the holding device of FIG. 6(a) because the spring force is concentrated directly on top of the rod.

The microwave frequency absorber eliminates all modes but TE0iN (wherein i and N are each integers greater than or equal to 1, preferably 1, 2, or 3, and most preferably i and N are both 1) modes because TE0iN modes carry only circular currents. The absorber can be any ferrite material. The absorber used in this embodiment is ECCOSORB® (available from Emerson & Cuming Inc., Woburn, Mass. 01888). The absorber is located in recess 105 as shown in FIG. 2(a).

Once the resonator body in FIG. 3(a), the bottom plate in FIG. 3(g) and the two connectors of FIG. 1(e) are fastened together (as shown in FIGS. 1(a) and 1(b)), there are several steps required to assemble the remainder of the resonator. If drawer #1 and sapphire locater #1 are used, the first step is to position the bottom film (17), and sapphire rod (5) (FIG. 1(d)) in the resonator. This step is carried out by placing the film in the recess (100) of drawer #1 (FIG. 2(a)). The microwave frequency absorber is placed in recess (105) of drawer #1 (FIG. 2(a)). Two sapphire locaters #1 (FIG. 2(d)) are then placed opposite to each other on drawer #1. At this time, drawer #1 is slid in and bolted on resonator body (25) using screws (75) depicted in FIG. 1(a). Next, dowel pins (115) (FIG. 2(b)) are inserted through holes (130) (FIG. 2(d)) of sheet (120) and holes (80) (FIG. 2(a)) of drawer #1 to locate exactly the circle formed by arcs (125) (FIG. 2(d)) relative to resonator body (25) (FIG. 1(b)). The sapphire rod (5) is positioned into the circle formed by arcs (125). The second step is to position the top film (17) in the resonator. To accomplish this step (FIG. 1(b)), the piston locater (52) is located on top of body (25), with the help of dowel pins (70). The film (17) is then dropped into recess (185) of the piston (FIG. 4(a)). After covering the hole (180) with a suction device, piston (FIG. 4(a)) is picked up, turned upside down and guided into the resonator at position (35) in FIG. 1(b)). Then, the suction device and the piston locater are removed. The last step is to place a holding device (FIGS. 6(a), 6(b) and 6(c)) in recess (195) of the piston (FIG. 4(b)), put the top plate (30) (FIG. 1(b)) on top of resonator body (25), and tighten screws (87). When the resonator is ready for testing, dowel pins (115) and sapphire locaters #1 are removed from body (25). Shims (32) will be added or removed to adjust the coupling strength of either connector.

If drawer #2 and locater #2 are used, the assembly can be followed using FIGS. 1(a), 1(b), 1(c), 1(d), 1(e), 2(c), 2(d) and 4(a). The first step is to position the bottom plate (20) and the connectors (95) (FIG. 1(e)) to the body (25). The second step is to position the bottom film (17), and sapphire rod (5) in the resonator. This step is carried out by placing the film in the recess (100) of drawer #2 (FIG. 2 (f)). Sapphire locater #2 (FIG. 2(i)) is then placed on drawer #2. Sapphire locater #2 is confined by the walls of the resonator body (25) and pins (110). The sapphire rod (5) is positioned into circle (140). The third step is to position the top film (17) in the resonator. To accomplish this step, the piston locater (52) (FIG. 4(e)) is set on top of body (25) (FIG. 1(b)), with the help of dowel pins (70). The film (17) is then dropped into recess (185) of piston (35), FIG. 4(a). After covering the hole (180) with a suction device, piston (35) is picked up, turned upside down and guided into the resonator. Finally, the suction device and the piston locater are removed. The last step is to place a holding device in recess (195) (FIG. 4(b)) of the piston, and as depicted in FIG. 1(b), put the top plate (30) on top of body (25), and tighten screws (87). Shims (32) will be added or removed to adjust the strength of the coupling.

Figure 7C:
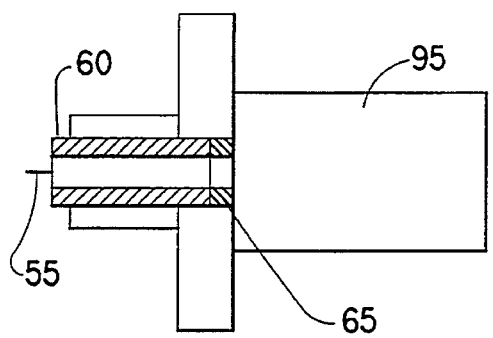
FIG. 7(c) is an cross-sectional view of the connector assembly.

This invention further comprises a sapphire resonator of a second design, denoted sapphire resonator #2. The design of this resonator is shown in FIGS. 7(a) through 7(e). FIG. 7(d) shows a sapphire dielectric (5), conveniently a rod, is sandwiched between two films (17). FIG. 7(e) shows the film (17) as a substrate (10) which is coated on one or both sides with superconducting materials (15). Substrate (10) must be a single crystal that has a lattice matched to the superconducting material. As shown in FIGS. 7(a) and 7(b) the resonator body outer enclosure (295) sits on top of the bottom plate (305). The sapphire rod (5) is centered in the resonator by a locating device (260) to be described later. As seen in FIG. 7(b) piston (290) sits on top of sapphire rod (5) and holds the top film (17). A piston locater (285), is located relative to the body by pins (250). A holding device (50), described later, together with the top plate (280) will exert a pressure on the film-sapphire-film structure and hold the structure in place during use, i.e., the film characterization process. Two connector assemblies, as shown in FIGS. 7(b) and 7(c), each consisting of a connector (95), a transition (60), one cable (55), and one insulator (65), will couple the resonator to an electrical circuit. As shown in FIG. 7(b) shims (292) are used to adjust the strength of the coupling of either connector. All components of the resonator are fixed in place by screws (265).

FIG. 8(a) shows the design of body of resonator #2 depicted as (295) in FIGS. 7(a) and 7(b). At the center is a hole (320). Its diameter is calculated proportionally to the sapphire dielectric diameter, conveniently a rod, to maximize the performance. The ratio between the hole (320) diameter and the diameter of the sapphire rod must be greater than 2.0. The ratio used in this embodiment is 3.3. The surface created by hole (320) is polished to reduce the energy loss caused by microwave absorption. There are two dowel pins (250) for guiding the top plate and the piston locater. Three tapped holes (310) are used to attach the body to the bottom plate. There is an engraved line (325) to indicate the orientation of the bottom film. FIG. 8(b) shows a side view of the body of resonator #2. Three tapped holes (315) are for entry of the sapphire locater devices. FIG. 8(c) shows a different side view of the body of resonator #2. Tapped holes (330) and hole (335) are used to attach connectors to the body.

FIGS. 8(d) and 8(e) show the design of the top plate of resonator #2 depicted as (280) in FIG. 7(b). It has a counterbored hole (340) to clear the piston diameter, two clearance holes (345), and three countersink holes (342). Holes (345) are for pins (250) in FIGS. 7(a) and 7(b). Holes (342) are for screws (265) shown in FIG. 7(a).

FIGS. 8(f) and 8(g) show the design of the bottom plate depicted as (305) in FIG. 7(b). Similar to resonator #1, bottom plate (305) has four tapped holes (350) as shown in FIG. 8(f) to mount the resonator onto a supporting device (not shown), which is inserted into a dewar flask (not shown). There are three countersink holes (380) as shown in FIG. 8(f). Holes (380) are for screws (265) as shown in FIG. 7(b). As shown in FIG. 8(g) the bottom plate also has one recess (355) to locate a superconducting film (not shown), and another recess (370) for microwave absorber (not shown). The depth of recess (355) is such that the surface of the film is slightly above surface "A" as shown in FIG. 8(g), preferably 0.025 mm. The bottom of the recess, surface "B" as shown in FIG. 8(g), and surface "A" must be parallel to each other within 0.076 mm, preferably 0.025 mm. The above surfaces must also be perpendicular to axis "D" as shown in FIG. 8(g) within ±1°. To center the film in the resonator, diameter (360) is made to slip fit to the body of the resonator. Diameter (365) is smaller than diameter (360) to create a circular gap; so microwaves can reach the microwave absorber painted in the recess (370). This gap could range from 0.254 mm–1.016 mm (total), and preferably is 0.508 mm. Two slots (375) are used to mount several heaters to control and stabilize the resonator temperature.

Figure 9A:
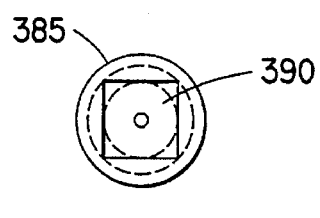
FIG. 9(a) illustrates the design of the piston of resonator #2.
Figure 9B:
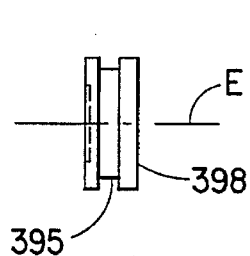
FIG. 9(b) is a cross-sectional view of the piston of resonator #2.
Figure 9C:
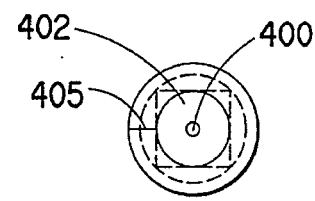
FIG. 9(c) is a bottom view of the piston of resonator #2.

FIGS. 9(a), 9(b) and 9(c) show the design of the piston. The piston is depicted as (290) in FIG. 7(b). The piston has a recess (390) for a superconducting film (not shown), a recess (395) for microwave absorber (not shown), a through hole (400) for vacuum to reach the film, and an engraved line (405) to indicate the orientation of the film. The depth of recess (390) is such that the surface of the film is slightly above the surface of the piston recess (390), preferably 0.025 mm. Diameter (385) is made smaller than the hole of the body of the resonator (shown as (320) in FIG. 8(a)) to create an even circular gap for cooling gas such as helium to reach the center of the resonator. A counterbore (402) is used for placement of a holding device (not shown). The bottom of the recess (390), the top of the recess (390), and the bottom surface (398) of the piston must be parallel to each other within 0.076 mm, preferably 0.025 mm. The above surfaces must also be perpendicular to axis "E" of the piston, shown in FIG. 9(b) within ±1°.

Figure 9F:
FIGS. 9(e) and 9(f) illustrate the design of the sapphire locating device of resonator #2.
Figure 9D:
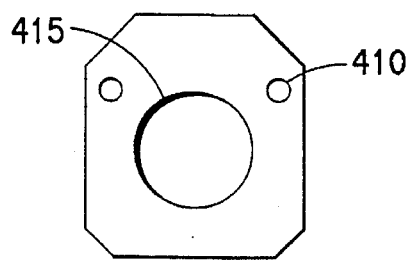
FIG. 9(d) illustrates the design of the piston locater of resonator #2.

FIG. 9(d) shows the design of the piston locater. This is depicted as (285) in FIG. 7(b). It is a plate of either plastic or metal which has a hole (415) through which the piston will pass with minimal clearance to guide the piston, and two clearance holes (410). Holes (410) are for pins (250) shown in FIG. 7(b).

Figure 9E:
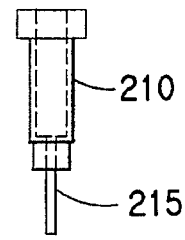

FIGS. 9(f) and 9(e) show the design of a sapphire rod locating device which is a modified shoulder screw (210) with a sapphire rod (215) at the end. The rod is inserted into the screw and held in place by adhesive or by other known method. This locating device is depicted as (260) in FIG. 7(a).

Any of the holding devices shown in FIGS. 6(a), 6(b), or 6(c) can be employed with resonator #2. Resonator #2 uses identical transition shown in FIGS. 3(i) and 3(j) and insulator shown in FIGS. 3(k) and 3(m) as in resonator #1. The penetration of the cables into the resonator is adjusted by adding or removing the shims (292) as shown in FIG. 7(b).

There are two major differences between resonator #1 and resonator #2. Unlike resonator #1, which does not allow the microwaves to be exposed to the material of the drawer, a superconducting film of resonator #2 is smaller than surface "A", FIG. 8(g); so microwaves will be exposed to both the superconducting material as well as the platform material. The other difference is the height of the sapphire rod whereas the height is 2.5 mm in resonator #1, it is 2 mm in resonator #2.

The assembly of resonator #2 can be followed using FIGS. 7(a), 7(b), 7(d), 8 (f), 8(g), 9(a), 9(b) and 9(c). The first step is to fasten the bottom plate (305) and the connectors (95) to the body (295) (FIGS. 7(b) and 7(c)). The second step is to place film (17) in the recess (355) of the bottom plate FIG. 8 (f). Next, screw subassemblies (260) (FIG. 7(a)) are partially turned into the body (295). At this time, the sapphire rod (5) is placed roughly at the center of body (295). Then, the screw subassemblies are turned until they are stopped. During that time, the sapphire rod is moved to the exact center of the body. The next step is to position the top film (17) in the resonator. To accomplish this step, first, the piston locater (285) is set on top of body (295), with the help of dowel pins (250). The superconducting film is then dropped in recess (390) of the piston, FIG. 9(a). After covering the hole (400) (FIG. 9(c)) with a suction device, the piston is picked up, turned upside down and guided into the resonator. Then, the suction device and the piston locater are removed. The last step is to place a holding device, FIG. 6(c), in recess (402) (FIG. 9(c)) of the piston, put the top plate (280) (FIG. 7(b)) on top of the body, and tighten screws (265). When the resonator is ready for testing, the screw subassemblies are taken out. Shims (292) will be added or removed to adjust the strength of the coupling of either connector.

The designs of resonator #1 and #2 can be modified to test any film sizes, provided related dimensions such as film recesses, overall resonator dimensions, and sapphire rod dimensions are changed to accommodate for the new films and to assure the performance of the resonator is not affected.

Figure 10B:
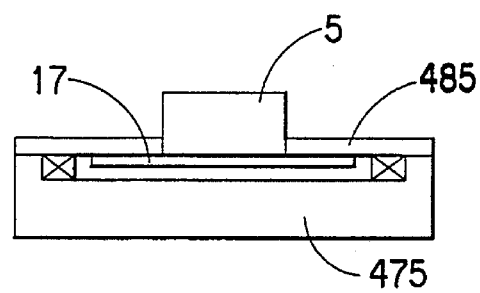
FIG. 10(b) is an explode cross-sectional view of a sapphire rod holding device used in modified resonator #1.
Figure 10C:
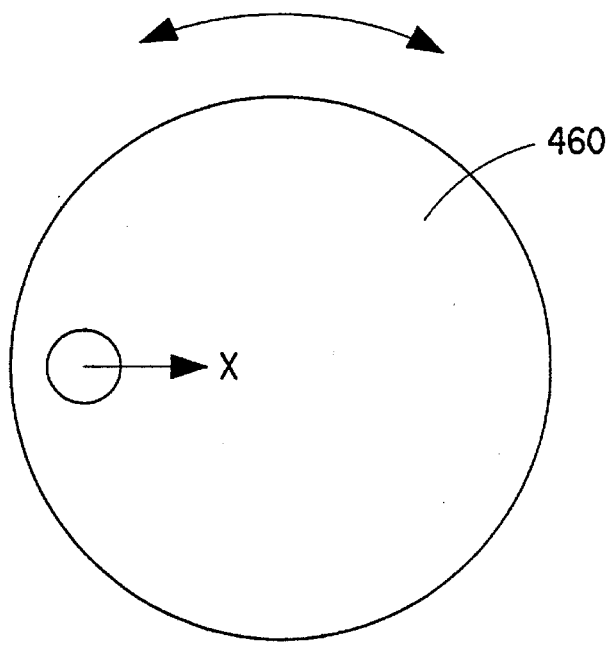
FIG. 10(c) is a top view of modified resonator #1.

The present invention further comprises a third variation of a sapphire resonator which is a modification of resonator #1. The apparatus is modified to determine the local surface resistance and the uniformity of a superconducting thin film on a large substrate as shown in FIGS. 10(a), 10(b), and 10(c). A large high temperature superconducting thin film can be tested at various discrete areas. This design has two subassemblies. The first assembly, shown in FIG. 10(a), has a cylindrical plate (460) that holds a wafer with superconducting film (455) on its underside. A vacuum hole (490) keeps film (455) from falling during the operation. Plate (460) is rotated around its center Z axis manually or mechanically, or by any other rotating device. The second subassembly is called a testing head. This subassembly includes the rest of components of the resonator as shown in FIG. 10(a). A sapphire dielectric (5), conveniently a rod, and a small high temperature superconducting film (17) are sandwiched between plate (460) and a piston (475). Body (445) is used to hold cables (450). Body (445), piston (475), and bottom plate (440) are held and guided by shoulder screws (480). Holding device (435), shown in FIGS. 6(a), 6(b) and 6(c), is used to keep all components together during operation. Rod (430) is welded, or screwed, or fastened by any equivalent method, to bottom plate (440) of the resonator. The other end of rod (430) is connected to an actuator (420). The actuator can be any device that reciprocates rod (430) up and down in the Z direction perpendicular to plate (460), and moves the testing head in the X direction as depicted in FIG. 10(c). FIG. 10(b) is an enlarged view that shows a nonmetallic sheet (485) used to center and to keep sapphire rod (5) from moving during operation. This sheet must have a low dielectric constant, and a low dielectric loss such as Kapton® or any polymer film. The testing head is connected to another actuator. The actuator can be an air cylinder, a liner actuator, or any device that moves the testing head in the X direction.

The design of piston (475) is identical to the piston described previously in FIG. 4(a) except for additional tapped holes for shoulder screws (480). The design of bottom plate (440) is identical to the plate described previously in FIG. 3(g) except for additional holes for shoulder screws (480). Sheet (485) is identical to sapphire locator #2 (FIG. 2 (i)) except its size is made to fit the recess of body (445).

In operation, as shown in FIGS. 10(a), 10(b) and 10(c), the testing head is moved to a desired location on the film (455). This is accomplished by the combination of the movement of the testing head in the X direction and the rotation of the plate (460) around its Z axis. Then, the actuator (420) moves the testing head in the +Z direction, compressing a holding device (435), previously described. At this time, film (17), sapphire rod (5), and film (455) forms a resonator similar to resonators #1 and #2. Film parameters at this location are recorded.

To test another location on film (455), actuator (420) lowers the testing head to keep the sapphire rod from touching film (455). The testing head and plate (460) are again moved to position the testing head immediately below the desired testing location. The next steps described in the previous paragraph are then repeated.

The invented apparatus are used for measuring the parameters such as surface resistance, $R_s$, critical current density, $J_c$, and critical rf magnetic field, $H_c$, for high temperature superconductors (HTS).

For a given $TE_{011}$ mode HTS-sapphire-HTS resonator, the surface resistance, $R_s$, is inversely proportional to the unloaded Q-value, $Q_0$, of the resonator:

$$R_s = G/Q_0 \quad (1)$$

Here G is the geometry factor, which can be either calculated by using the formulas given in Shen et al., 1992 IEEE-MTT-S International Microwave Symposium Digest, pp. 193–196 or calibrated by a conductor such as copper with known $R_s$. Therefore, the measurement of $R_s$ is simply to measure the $Q_0$ of the resonator, which is known in the art.

In a $TE_{011}$ mode resonator, the maximum rf magnetic field, $H_{max}$, and the corresponding maximum current density, $J_{max}$, in the HTS films are related to the $R_s$ and the dissipated power, $P_0$, in the resonator as follows:

respectively; $\zeta_1$ is the transverse wave number in the sapphire rod; $\lambda$ is the wave length; $\lambda_d$ is the penetration depth $\rho$ is the radial dimension variable and $d\rho$ is the differentiation of $\rho$. For a given resonator, all these quantities are constants. Therefore, the $H_{max}$ and $J_{max}$ can be determined by measuring the $R_s$ and $P_0$ ($P_0$ can be measured by using a power meter). The resonators of the present invention provide measurements of improved accuracy and are reliably reproducible. For example, resonator #1 with drawer design #2 provided reproducibility at a level of 2%. The resonators of the present invention are easy to assemble while retaining superior sensitivity. Thus the apparatus are useful as a quality control tool for monitoring superconducting thin film manufacturing processes.

The critical magnetic field, $H_c$, can be determined by the $H_{max}$ value at which the $R_s$ value exceeds certain selected criteria. The $J_c$ is simply equal to $H_c/\lambda_d$.

EXAMPLE 1

Figure 11:
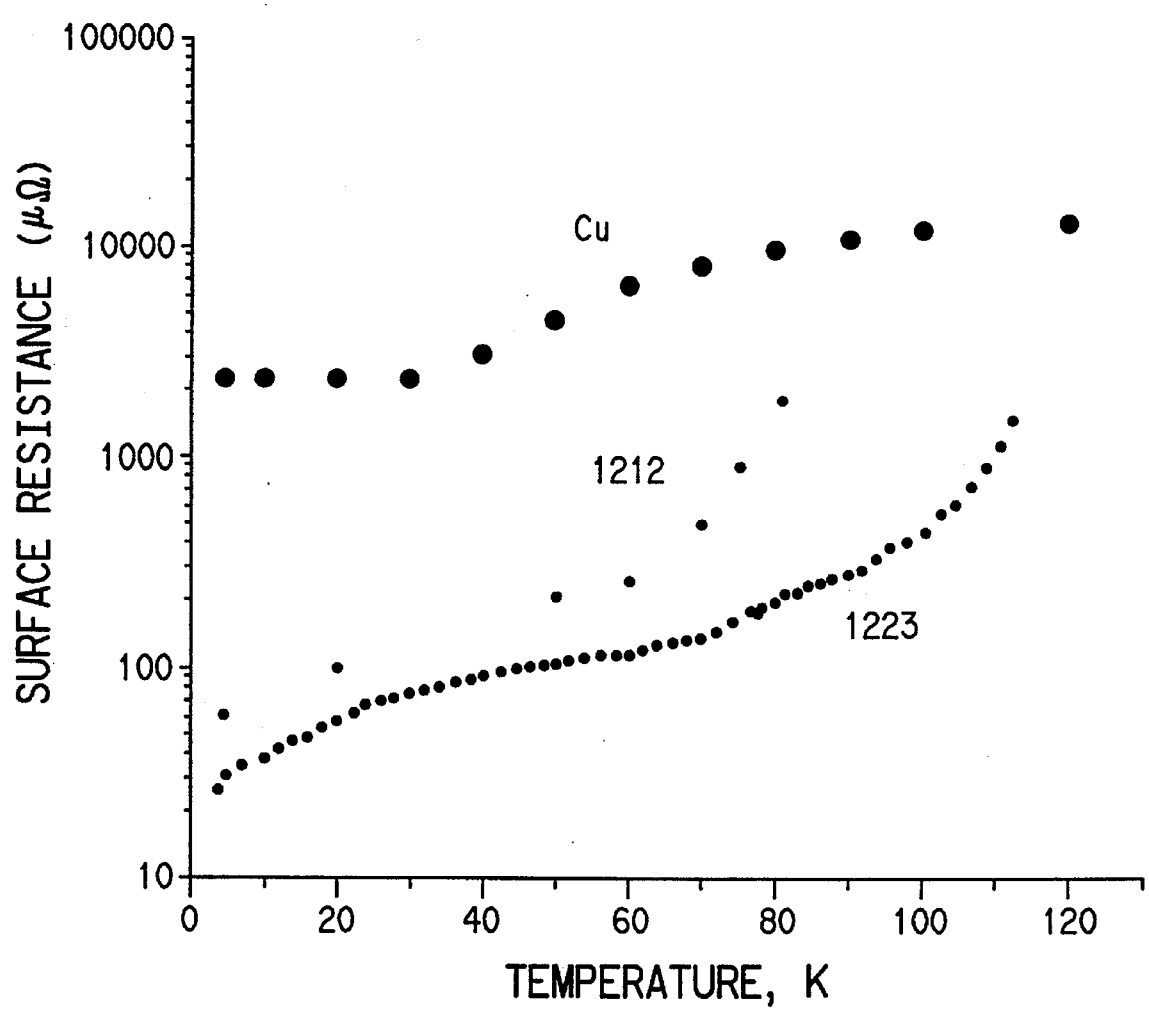
FIG. 11 is a graph of the surface resistance of two phases of (TlPb)SrCaCuO and Cu vs. temperature as determined in Example 1.

The surface resistance, $R_s$, of the superconductor TlPbSrCaCuO (1212) and (1223) phases was measured using resonator #1 with drawer #2 assembled as previously described. The data measurements were performed in a liquid helium storage dewar with a glass epoxy insert. The resonator assembly was mounted on a copper plate at the end of a stainless steel probe. The assembly was then evacuated and lowered into the insert. Temperature was controlled with a pair of 100 W heaters. A HP-8510 vector network analyzer with 1 Hz frequency resolution was used for the measurements. A HP-8449A preamplifier and a Hughes 8030H02F TWT power amplifier with output power up to 30 W were inserted at the input of the resonator for the high powdered measurements. The $R_s$ was measured at 27 GHz. The resulting data are shown in FIG. 11 which depicts how the surface resistance of the superconductor TlPbSrCaCuO (1212) and (1223) phases, as well as a conducting Cu reference, vary with temperature. It is plotted at 10 GHz, according to $f^2$ low as a function of temperature. The copper (Cu) data are for reference.

EXAMPLE 2

Figure 12:
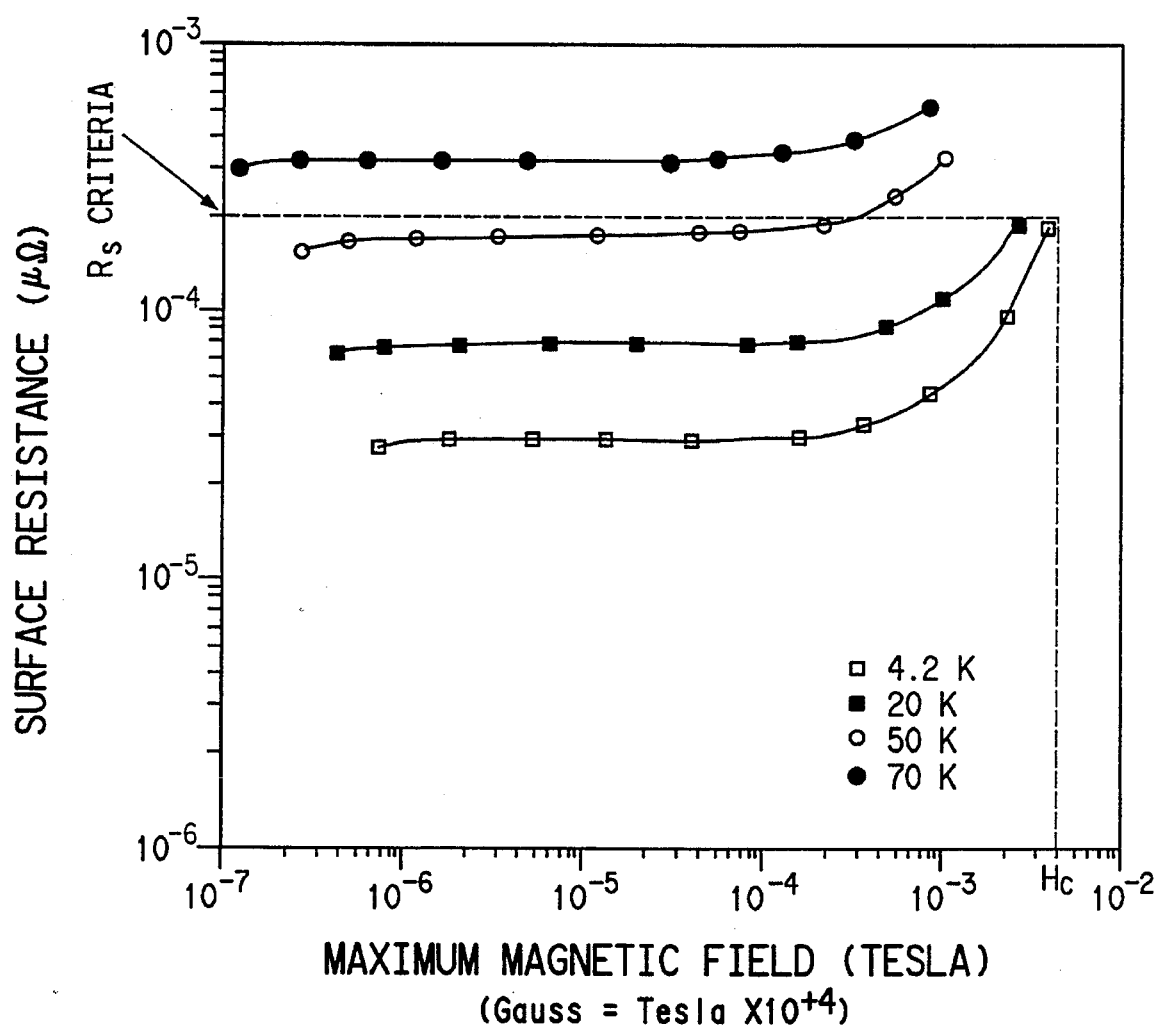
FIG. 12 is a graph of the surface resistance of YBaCuO vs. maximum magnetic field at various temperatures as determined in Example 2.

The surface resistance, $R_s$, of the superconductor $YBa_2CuO_{7-a}$ wherein a is less than 1 was measured using resonator #1 with drawer #2 assembled as previously described using the procedure of Example 1 except that the $R_s$ was measured at 5.55 GHz. The resulting data for surface resistance at various temperatures are shown in FIG. 12 graphed as a function of maximum rf magnetic field. The critical magnetic field $H_c$ is shown as the maximum mag- $$H_{max} = J_{1,max} \left\{ \frac{2\pi R_s}{P_0} \int_0^a J_1^2(\xi_1 \rho) \rho d\rho \left[ 1 + \epsilon_r R + \frac{240\pi^2 \epsilon_r \tan\delta}{R_s} \left( \frac{L}{\lambda} \right)^3 \right] \right\}^{-1/2} \quad (2.a)$$

$$J_{max} = \frac{J_{1,max}}{\lambda_d} \left\{ \frac{2\pi R_s}{P_0} \int_0^a J_1^2(\xi_1 \rho) \rho d\rho \left[ 1 + \epsilon_r R + \frac{240\pi^2 \epsilon_r \tan\delta}{R_s} \left( \frac{L}{\lambda} \right)^3 \right] \right\}^{-1/2} \quad (2.b)$$

Here $J_1(x)$ is the 1st order Bessel function of the 1st kind; $J_{1,max}=0.582$ is the maximum value of the $J_1(x)$; $\epsilon_r=9.32$ and $\tan\delta$ are the relative dielectric constant and the loss tangent of sapphire, respectively; R is the ratio of the electrical energy stored inside to that stored outside of the sapphire rod; a and L are the radius and the length of the sapphire rod, netic field value at which the $R_s$-value exceeds certain selected criteria.

What is claimed is:

1. A dielectric resonator apparatus, operating in $TE_{0iN}$ mode, where i and N are integers greater than or equal to 1, having a dielectric element of sapphire positioned between and in contact with two discrete films of at least one superconducting material, all encased in an outer enclosure having a means for magnetic dipole coupling connected to an electrical circuit, said means for magnetic dipole coupling held in place by and extending through said outer enclosure and said means for magnetic dipole coupling characterized by a magnetic dipole coupling strength relative to said electrical circuit, wherein the improvement comprises:

(a) means for positioning the sapphire dielectric relative to the outer enclosure and between the two discrete films;

(b) means for positioning the two discrete films relative to the outer enclosure and relative to the sapphire dielectric;

(c) means for holding the sapphire dielectric and the two discrete films in contact during operation;

(d) means for suppressing a mode other than $TE_{011}$, said means for suppressing located inside the outer enclosure and outside a cavity, said cavity being defined as the space existing between the two discrete films and between the sapphire dielectric and the outer enclosure; and (e) movable means for adjustment of the strength of the magnetic dipole coupling to an electrical circuit, located between the two discrete films and inside said cavity, but without contacting the two discrete films and the sapphire dielectric.

2. The resonator of claim 1 wherein the means for positioning the sapphire dielectric comprises two non-metallic sheets each having (1) a notch centered on one edge, said notch having a size and a shape suitable to fit against the sapphire dielectric, (2) a hole to permit positioning the sapphire dielectric relative to the outer enclosure with a dowel pin, and (3) chamfers at corners of the edge containing the notch.

3. The resonator of claim 1 wherein the means for positioning the sapphire dielectric comprises a rectangular non-metallic sheet having (1) an opening of a size and a shape through which the sapphire dielectric will pass with minimal clearance and (2) chamfers at two adjacent corners.

4. The resonator of claim 2 or 3 wherein the sheet comprises a polymeric film having a dielectric constant with a maximum value of 4.

5. The resonator of claim 2 or 3 wherein the sheet is comprised of polyimide Kapton 300HN.

6. The resonator of claim 1 wherein the means for positioning the sapphire dielectric comprises a plurality of screws inserted through openings in the outer enclosure, said screws having non-metallic tips, said tips contacting the sapphire dielectric.

7. The resonator of claim 6 wherein the non-metallic tips comprise sapphire tips.

8. The resonator of claim 1 wherein the means for positioning the sapphire dielectric comprises (1) a device comprising a platform to which is attached perpendicular to the platform an extension having a recess into which the dielectric fits, (2) a hole running through said extension and platform for application of an external vacuum to hold the dielectric in place in the recess, and (3) at least two additional holes and dowel pins for positioning the device relative to the outer enclosure, each of said additional holes used to guide said dowel pins.

9. The resonator of claim 1 wherein the means for positioning the superconducting film comprises a drawer of non-ferrous metal having (1) a first recess for holding the superconducting film, (2) a second recess for holding a microwave frequency absorber surrounding said first recess; (3) at least two holes for dowel pins in a surface of the drawer having said recesses; and (4) at least two holes for screws in a surface of the drawer perpendicular to said recesses.

10. The resonator of claim 1 wherein the means for positioning the superconducting film comprises (1) a piston having (*a*) a first recess to hold the superconducting film, (*b*) a second recess to hold a microwave frequency absorber, (*c*) a hole running through said piston for application of an external vacuum to hold the said film in place, and (*d*) a counterbore, and (2) a piston locator in the form of a flat sheet containing an opening through which the piston will pass with minimal clearance and at least two holes, one on each side of said opening, and dowel pins used in said holes for positioning said piston locator relative to the outer enclosure.

11. The resonator of claim 10 wherein the piston has a diameter such that the piston will fit into the outer enclosure with sufficient clearance to permit passage of a cooling gas from an external source.

12. The resonator of claim 1 wherein the means for holding the sapphire dielectric and superconducting film in place during operation comprises at least one helical compression spring secured to a top plate of the outer enclosure, said spring being compressed when the top plate is in place.

13. The resonator of claim 1 wherein the means for holding the sapphire dielectric and superconducting film in place during operation comprises at least one helical compression spring secured to a piston holding the superconducting film, said spring being compressed when the top plate is in place.

14. The resonator of claim 1 wherein the means for holding the sapphire dielectric and superconducting film in place during operation comprises a plate of material which compensates for thermal contractions of the resonator at cryogenic temperature.

15. The resonator of claim 14 wherein the plate is comprised of Teflon®.

16. The resonator of claim 1 wherein the means for holding the sapphire dielectric and superconducting film in place during operation comprises a plurality of disc springs stacked between the means for holding the superconducting film and an inside surface of a top plate of the outer enclosure.

17. The resonator of claim 1 wherein the means for suppressing undesirable modes comprises a microwave absorber contained in a recess in the means for positioning the superconducting film which surrounds the superconducting film.

18. The resonator of claim 1 wherein the means for adjusting the strength of the magnetic dipole coupling comprises adjusting penetration into the resonator enclosure of a cable extending from at least one connector by inserting or removing shims between the resonator body and a flange on said connector employed for the magnetic dipole coupling.

19. The resonator of claim 1 further comprising said means for connecting the resonator to an electrical circuit which is a connector having (1) a transition element comprising an electrical conductor tube having an outer diameter which is inserted into a commercial connector and an inner diameter into which is inserted a cable having an outside diameter of a maximum of 0.94 mm, said cable comprising said means for magnetic dipole coupling, and (2) an insulator comprising a dielectric ring having an outer diameter equal to the outer diameter of the transition element and an inner diameter less than the diameter of the conductor tube of the transition element.

20. The resonator of claim 19 wherein the transition element is comprised of oxygen free copper and the insulator is comprised of Teflon®.

* * * * *